United States Patent
Zaharinova-Papazova et al.

(10) Patent No.: US 6,667,929 B1
(45) Date of Patent: Dec. 23, 2003

(54) POWER GOVERNOR FOR DYNAMIC RAM

(75) Inventors: Vesselina K. Zaharinova-Papazova, Poughkeepsie, NY (US); William W. Shen, Los Altos, CA (US); Henry Chin, Pittsburgh, PA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/171,863

(22) Filed: Jun. 14, 2002

(51) Int. Cl.[7] .................................................. G11C 7/00
(52) U.S. Cl. ....................... 365/226; 365/222; 365/236; 365/189.07
(58) Field of Search ................................ 365/226, 222, 365/236, 189.07

(56) References Cited

U.S. PATENT DOCUMENTS

| | | | |
|---|---|---|---|
| 5,734,919 A | * 3/1998 | Walsh et al. | 713/300 |
| 5,844,849 A | 12/1998 | Furutani | 365/194 |
| 5,926,435 A | 7/1999 | Park et al. | 365/233 |
| 5,996,083 A | 11/1999 | Gupta et al. | 713/322 |
| 6,038,673 A | 3/2000 | Benn et al. | 713/323 |
| 6,141,278 A | * 10/2000 | Nagase | 365/222 |
| 6,459,621 B1 | * 10/2002 | Kawahara et al. | 365/185.24 |

* cited by examiner

Primary Examiner—Michael S. Lebentritt
Assistant Examiner—Tuan T. Nguyen
(74) Attorney, Agent, or Firm—Lynn L. Augspurger; Laurence J. Marhoefer

(57) ABSTRACT

Apparatus for limiting the power consumption of a random access memory (RAM), having in combination a counter for counting the number of memory commands in a sample interval, and power governor control logic responsive to the number of memory commands, for limiting the maximum number of transfer requests processed in a sample interval when the counter accumulates a count exceeding a predetermined value.

13 Claims, 4 Drawing Sheets

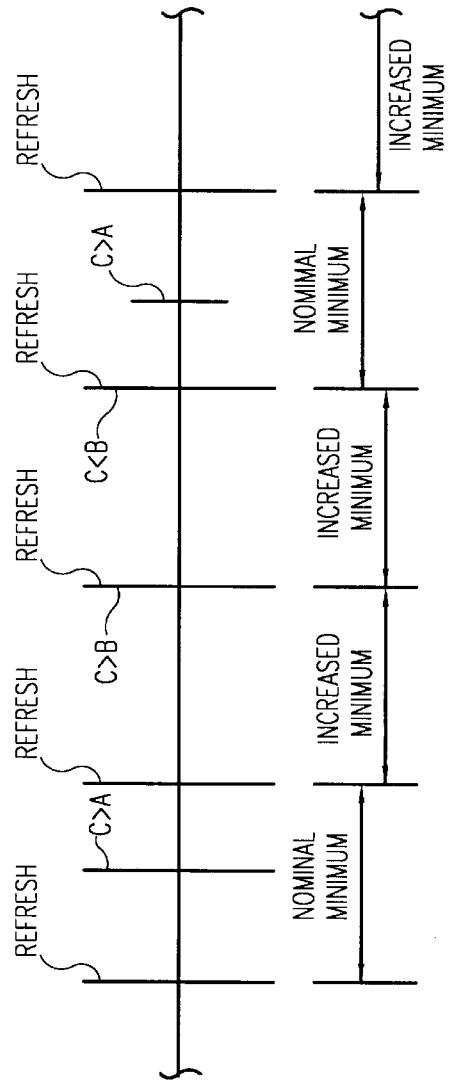
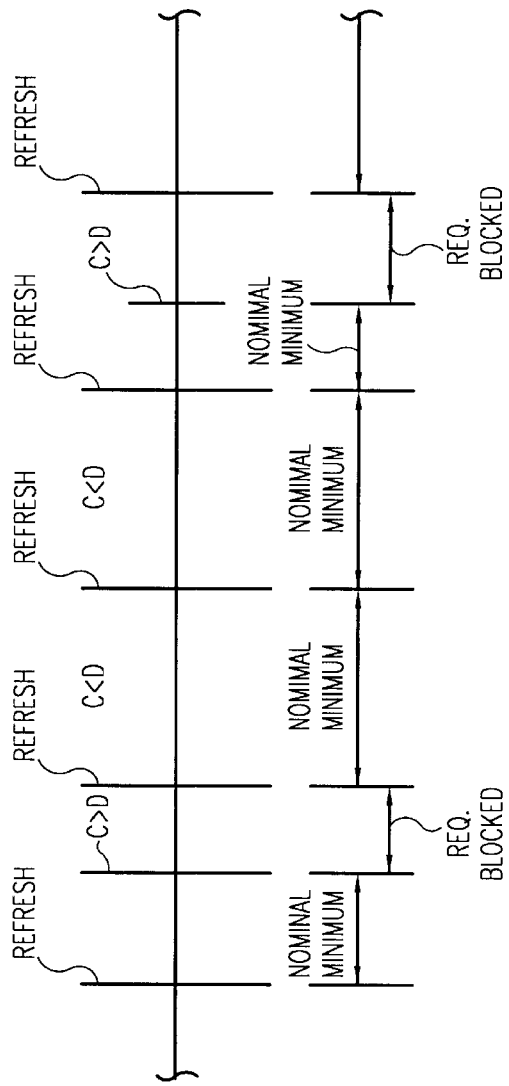
FIG. 4
FIG. 7

POWER GOVERNOR FOR DYNAMIC RAM

FIELD OF THE INVENTION

This invention relates to a method and apparatus for limiting the power consumption of a computer processor, dynamic random access memory (DRAM) subsystem, and more particularly, to a method and apparatus that is relatively simple to implement with existing DRAM subsystems.

BACKGROUND

Technical issues, such as a need for cooling and a small physical size, place a restriction on the amount of power available in a computer system. At the same time, a demand for increased computer performance pushes up memory size and operating frequency and this, in turn, requires additional power from the system power supply.

A number of proposals have been made in the prior art to limit the power consumption of computer processors, including inhibiting access to one port of a dual ported RAM. In general these prior art proposals are based upon decreasing power for a function where the need for the function decreases.

SUMMARY OF THE INVENTION

An object of this invention is the provision of a method and apparatus to limit the average power consumption of a DRAM subsystem in a computer processor by indirectly measuring actual power consumption and decreasing the power consumption when the consumption exceeds a preset amount.

Another object is the provision of a system that is easy to implement with existing DRAM subsystems, and that has a small impact on DRAM subsystem operation.

Briefly, this invention contemplates the provision of a method and apparatus to limit the average power consumption of a DRAM memory subsystem by determining the number of memory transfers in a sample interval and reducing the maximum transfer rate if the number exceeds a predetermined value. In a specific embodiment, the system counts the number of memory transfers requested in a sample interval, which preferably is defined as the interval between the DRAM refresh cycles. If the count exceeds a predetermined number, the system increases the minimum interval between memory transfer requests in succeeding sample intervals until the count in a succeeding sample interval is below another lower predetermined number. The system then reestablishes the minimum interval between transfers to the interval dictated by parameters established by the memory subsystem uninhibited by the power consumption limiting system of this invention.

DESCRIPTION OF THE DRAWINGS

FIG. 2 is a diagram illustrating the relative timing of memory transfer requests in accordance with the teaching of this invention.

FIG. 4 is a diagram illustrating state transitions with respect to sample interval timing.

FIG. 7 is a diagram similar to FIG. 4 illustrating the operation of the embodiment of FIG. 6.

DETAILED DESCRIPTION OF THE INVENTION

Referring now to FIGS. 1 through 5, a typical computer processor DRAM subsystem includes a plurality of DRAM chips 12, and control logic 14, which process transfer requests received on [[buss]] bus 16 from CPU 18. Periodically, the REFRESH controller 27 sends a REFRESH command to the control logic to initiate a DRAM refresh cycle. The refresh cycle occupies a relatively short interval compared to the interval between refresh cycles.

As will be appreciated by those skilled in the art, the minimum interval between transfers is determined by system parameters. The CPU can send multiple transfer requests to the DRAM controller. The DRAM controller generates the necesary command in order to perform the requested memory transfers. For example [[eaxh]] each single line memory transfer contains ACTIVATE command followed by READ or WRITE command. The rate at which the memory transfers are being processed is determined by the DRAM controller. Of course, system is not always requesting transfers at the maximum rate possible. But when requests are processed at or near this rate for a sustained period, the power control governor of this invention reduces the maximum rate at which transfers are processed in order to reduce the power demand.

Figure 1:
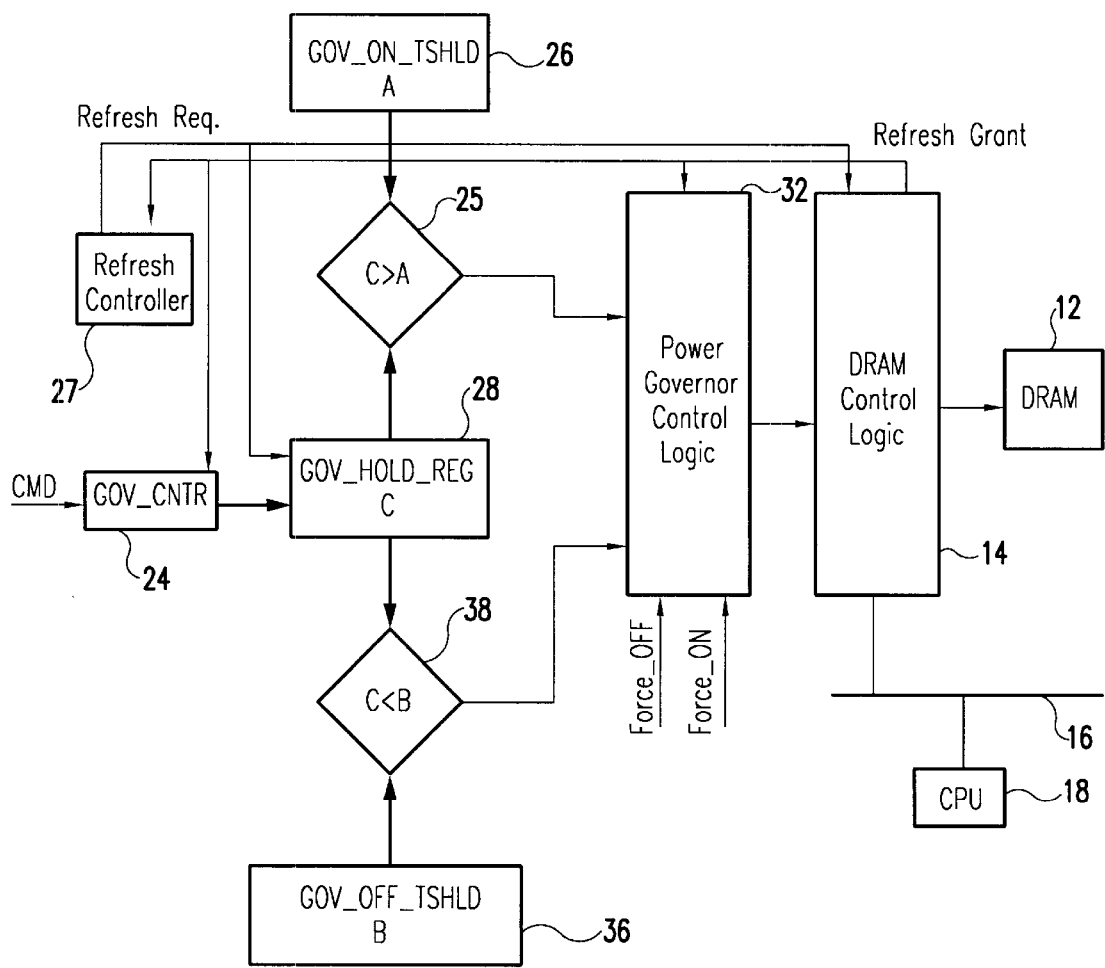
FIG. 1 is a block diagram of one embodiment of a DRAM system in accordance with the teachings of this invention.
Figure 2A:
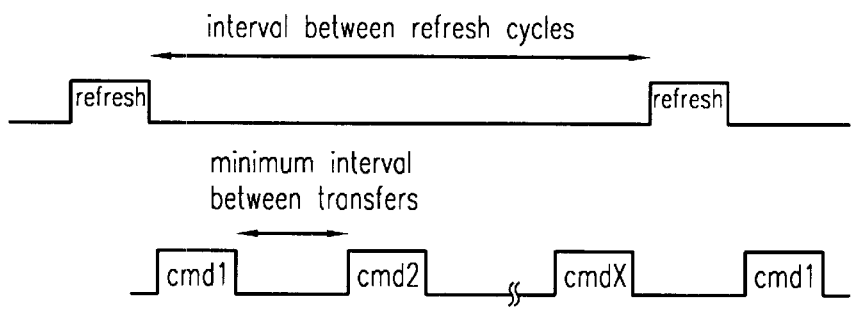
FIG. 2A illustrates the timing with the power control logic in an "OFF" state.
Figure 2B:
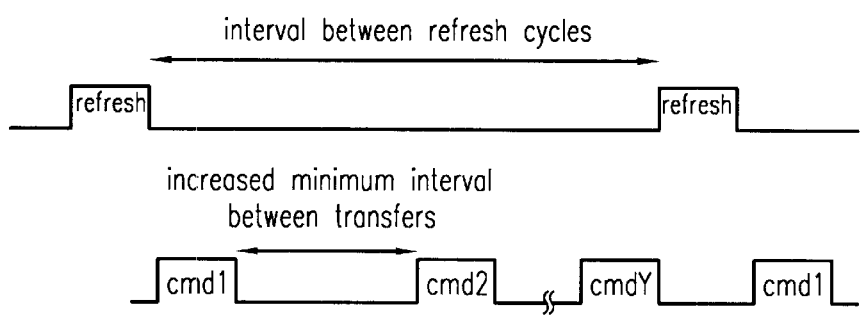
FIG. 2B illustrates the timing with the power control logic in an "ON" state.

Each DRAM requires a refresh cycle within a certain maximum period of time, and the interval between refresh cycles is fixed for a given DRAM technology. Thus, the interval between refresh cycles provides a convenient sampling interval for determining the transfers rate. A command (i.e. ACTIVATE, READ, or WRITE) to fetch or store data in the DRAM is a memory transfer operation upon which the DRAM power consumption strongly depends. In accordance with the teachings of this invention, the power consumption of the DRAM is indirectly measured by counting the number of memory commands in each sample interval, here the interval between refresh cycles as illustrated in FIG. 2. If the number of commands during the sample interval exceeds a predetermined number, the power governor control logic 32 increases the minimum interval between transfers in the next sample interval. The minimum interval remains at the increased value until the number of transfers during a subsequent sample interval is less than a predetermined number, which is preferably less than the first number to prevent system oscillation. When system indicates that the number of commands has fallen in a subsequent sample intervals to a predetermined level, the minimum interval between transfers is restored to its nominal value.

The DRAM power consumption governor includes a counter 24 (GOV_CNTR) that counts the number of energy consuming commands sent to the DRAM subsystem within each sample interval, here defined by the interval between two consecutive refresh cycles. The refresh cycle is initialed by the refresh controller 27. During the first cycle of the refresh request the value C of the counter 24 is being latched into a hold register 28 (GOV_HOLD_REG). Further counting during this sample period can be halted, and the counter 24 can be reset.

Figure 3:
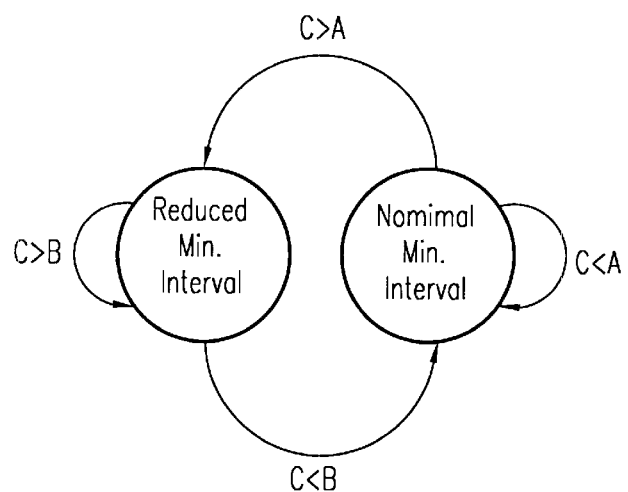
FIG. 3 is a state diagram illustrating the state transitions caused by the power governor control logic in response to the count in a sample period.

During each refresh cycle, which starts with a grant from a priority station to a refresh request, power governor control logic 32 makes a determination with respect to the minimum interval between memory transfers based on the input from compare logic 25 and [[35]] 38. It will be appreciated that, during this refresh cycle, all of the DRAM controller state machines are idle with the exception of the refresh controller. For this reason during the refresh cycle, a change in the minimum interval between memory transfers will not violate DRAM memory timing restrictions. Here, where the memory transfer command count C exceeds the predetermined number A, the power governor control logic 32 provides an output to control logic 14 to increase the minimum interval between transfers during the next sample interval. Conveniently, this can be accomplished by increasing time between two consecutive active commands or between an active command and the corresponding READ or WRITE command. As illustrated in FIG. 2, the minimum interval between successive transfers is increased. As illustrated in FIG. 3, if the minimum distance between transfer requests is in its nominal state, it stays in its nominal state during the next sample interval if the count does not exceed A. If the minimum interval between memory transfers is in its increased state, it stays in this state until the count at the end of a sample interval is less than the value "B" held in GOV_OFF_TSHLD register 36. When the count C at the end of the sample interval is less than B, the power governor control logic restores the nominal minimum timing between memory transfers.

A feature of the invention is forcing function. The FORCE_ON signal from the processor places the power governor control logic in a state where it increases the minimum interval between transfers, irrespective of the rate of transfer requests. Similarly, a FORCE_OFF signal from the processor places the power governor control logic in a state where it leaves the nominal minimum interval between transfers unchanged irrespective of the rate of transfer requests.

Figure 5:
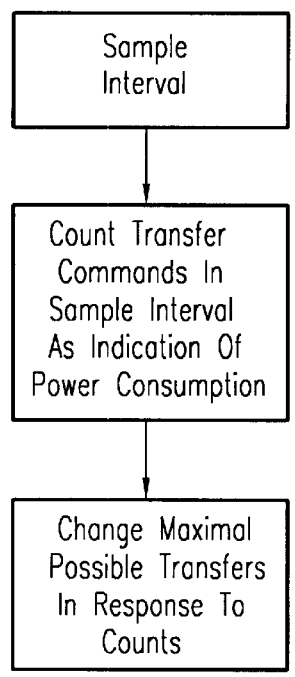
FIG. 5 is a flow chart of one embodiment of the method steps in implementing the power consumption limiting system in accordance with the teachings of the invention.

The operation of this embodiment of the invention can be summarized with reference to the flow chart of FIG. 5 and state diagram FIG. 3. The system establishes a recurring sample interval, preferably the interval between refresh cycle. During this interval the system counts the number of transfer commands as an indirect measure of power consumption by the DRAM. In response to the count the maximum power consumption during a sample interval is changed in accordance with the state diagram. Namely, if the minimum interval between transfers is at its nominal value during the sample, the minimum interval between transfers is increased during the next sample interval if the count exceeds A. Otherwise, if the count does not exceed A, the state remains unchanged during the next sample interval. If the minimum interval is at an increased value during a sample interval, the minimum interval between transfers is returned to its nominal value during the next sample interval if the count is less than B. If the count is greater than B, the state remains unchanged during the next sample interval.

Figure 6:
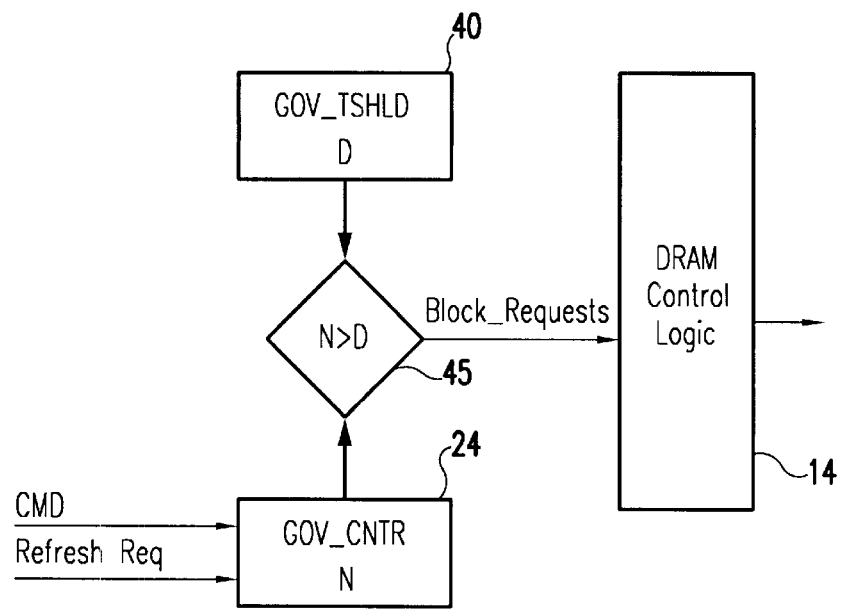
FIG. 6 is a block diagram similar to FIG. 1, but showing an alternate embodiment of the invention.

Referring now to FIGS. 6 and 7, in this embodiment of the invention, the number of transfer commands during the sample interval is counted as in the previously explained embodiment. Once the count C exceeds the value "D" in GOV_TSHLD 40, the power governor control logic output blocks the outstanding memory requests to DRAM control logic 14 until the end of that sample interval. The refresh signal is used to reset the counter. The time for executing a single fetch or store operation is unchanged, and the minimum time between consecutive unblocked transfers remains unchanged.

Here, it should be noted, this invention insignificantly decreases performance in response to extremely heavy workloads, and performance stays high for less heavy workloads. The invention accommodates the need for increased memory chip density and high operating frequency with need for reduced power supply package size. The power management is transparent to the operating system so that there is no need for the processor to be quiesced when the timing parameters are changed.

While the preferred embodiments of the invention have been described, it will be understood that those skilled in the art, both now and in the future, may make various improvements and enhancements which fall within the scope of the claims which follow. These claims should be construed to maintain the proper protection for the invention described above.

What is claimed is:

1. An apparatus for limiting the power consumption of a random access memory (RAM), comprising in combination:

a counter for counting the number of memory commands in a sample interval; and power governor control logic, responsive to said number of memory commands, for limiting an allowed maximum number of memory transfers in said sample interval when said counter accumulates a count exceeding a predetermined value.

2. The apparatus as in claim 1, wherein said power governor control logic increases an allowed minimum interval between memory transfers in said sample interval if the counter accumulates said count exceeding said predetermined value in a just preceding sample interval.

3. The apparatus as in claim 1 wherein said random access memory is a dynamic random access memory (DRAM) and said sample interval is defined by the interval between DRAM refresh commands.

4. The apparatus as in claim 1 wherein said power governor control logic blocks further memory transfers in said sample interval if the counter accumulates said count exceeding said predetermined value in that sample interval.

5. The apparatus as in claim 4 wherein said random access memory is a dynamic random access memory (DRAM) and said sample interval is defined by the interval between DRAM refresh commands.

6. The apparatus as in claim 1 wherein said power governor control logic increases an allowed minimum interval between memory transfers in a sample interval from a nominal interval to an increased interval and from said increased interval to said nominal interval based upon a count in a just preceding sample interval, said power governor control logic increasing said minimum interval if said count exceeds a value A in said just preceding sample interval and said nominal minimum interval was the interval established in the just preceding sample interval, said power governor control logic establishing said nominal interval if said count is less than a value B in said just preceding sample interval and said increased minimum interval was the interval established in said just preceding sample interval, and the value of A is greater than the value of B.

7. The apparatus as in claim 6 wherein said random access memory is a dynamic random access memory (DRAM) and said sample interval is the interval defined between two successive refresh commands.

8. A method for limiting the power consumption of a random access memory (RAM) including the steps of:

establishing a sample interval;

counting the number of memory commands in said sample interval;

limiting an allowed maximum number of memory transfers in said sample interval when said count exceeds a predetermined value.

9. The method as claimed in claim 8 wherein an allowed minimum interval between transfers is increased in order to limit the maximum number of memory transfers in said sample interval.

10. The method as in claim 9 wherein said random access memory is a dynamic random access memory and said sample interval is defined by the interval between refresh commands.

11. The method as in claim 8 wherein further memory transfers are blocked in said sample interval when said count exceeds said predetermined value.

12. The method as in claim 11 wherein said random access memory is a dynamic random access memory and said sample interval is defined by the interval between refresh commands.

13. The method as in claim 12 wherein the minimum interval between memory transfers in said sample interval is increased from a nominal interval to an increased interval and from said increased interval to said nominal interval based upon a count in a just preceding sample interval, said minimum interval increasing if the count exceeds a value A in said just preceding sample interval and said nominal interval was the interval established in the just preceding interval, establishing said nominal interval if said count is less than a value B in said just preceding sample interval and said increased minimum interval was the interval established in the just preceding interval, and the value of A is greater than the value of B.

* * * * *